United States Patent
Takahara et al.

(10) Patent No.: US 10,604,351 B2
(45) Date of Patent: Mar. 31, 2020

(54) ARTICLE TRANSPORT FACILITY

(71) Applicant: Daifuku Co., Ltd., Osaka-shi (JP)

(72) Inventors: Masahiro Takahara, Hinocho (JP); Akira Suzuki, Hinocho (JP); Tomoaki Nishikawa, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 290 days.

(21) Appl. No.: 15/891,760

(22) Filed: Feb. 8, 2018

(65) Prior Publication Data
US 2018/0222686 A1 Aug. 9, 2018

(30) Foreign Application Priority Data
Feb. 9, 2017 (JP) .................................. 2017-022224

(51) Int. Cl.
*B65G 43/08* (2006.01)
*H01L 21/67* (2006.01)
*H01L 21/677* (2006.01)
*B65G 17/48* (2006.01)

(52) U.S. Cl.
CPC .......... *B65G 43/08* (2013.01); *B65G 17/485* (2013.01); *H01L 21/6773* (2013.01); *H01L 21/67276* (2013.01); *H01L 21/67715* (2013.01); *H01L 21/67727* (2013.01); *H01L 21/67733* (2013.01); *B65G 2203/0283* (2013.01)

(58) Field of Classification Search
CPC . B65G 43/08; B65G 17/485; H01L 21/67733; H01L 21/67715; H01L 21/67727; H01L 21/6773; H01L 21/67276
See application file for complete search history.

(56) References Cited

U.S. PATENT DOCUMENTS

| | | | | |
|---|---|---|---|---|
| 6,799,521 B2* | 10/2004 | Tai | ........................ | B65G 1/0414 104/88.01 |
| 6,931,996 B2* | 8/2005 | Matsukawa | ............. | B61B 13/00 104/130.01 |
| 8,061,506 B2* | 11/2011 | Schafer | ................... | B65G 43/08 198/444 |
| 8,104,722 B2* | 1/2012 | Onishi | ................. | G05D 1/0265 246/122 R |

(Continued)

FOREIGN PATENT DOCUMENTS

JP        2010262594 A    11/2010

*Primary Examiner* — Patrick H Mackey
(74) *Attorney, Agent, or Firm* — The Webb Law Firm

(57) ABSTRACT

A travelling path includes a first path and a second path that branches off from or merges with the first path at a connection position of the first path. A management area and a check area are provided for the first path. The management area includes a section from the connection position to a position that is at a first preset distance upstream of the connection position, and a section from the connection position to a position that is at a second preset distance downstream of the connection position. The check area includes a section from a preset position to a position that is at a fourth preset distance upstream of the preset position. In a state where an article transport vehicle that includes a control unit is located in the check area, the control unit determines whether or not the article transport vehicle is in a leading state where no other article transport vehicle is present forward of the article transport vehicle in the check area.

6 Claims, 10 Drawing Sheets

(56) References Cited

U.S. PATENT DOCUMENTS

| | | | | |
|---|---|---|---|---|
| 8,322,287 B2* | 12/2012 | Oguro | .................... | B65G 37/02 |
| | | | | 104/88.01 |
| 8,768,545 B2* | 7/2014 | Ikeya | ....................... | B61B 3/02 |
| | | | | 701/19 |
| 9,086,697 B2* | 7/2015 | Suzuki | .............. | H01L 21/67276 |
| 9,283,935 B2* | 3/2016 | Fujioka | ............. | H01L 21/67715 |
| 9,793,147 B2* | 10/2017 | Ryu | ................. | H01L 21/67715 |
| 10,160,624 B2* | 12/2018 | Murakami | ................ | B66C 7/12 |
| 10,425,158 B2* | 9/2019 | Oh | ......................... | G02B 6/001 |
| 10,479,613 B2* | 11/2019 | Harasaki | ............. | H01L 21/6773 |
| 2014/0358338 A1* | 12/2014 | Harasaki | ........... | H01L 21/67715 |
| | | | | 701/19 |

* cited by examiner

ARTICLE TRANSPORT FACILITY

CROSS-REFERENCE TO RELATED APPLICATION

This application claims priority to Japanese Patent Application No. 2017-022224 filed Feb. 9, 2017, the disclosure of which is hereby incorporated in its entirety by reference.

BACKGROUND OF THE INVENTION

1. Field of the Invention

The present invention relates to an article transport facility that is provided with an article transport vehicle that travels along a travelling path, and a management apparatus that manages the article transport vehicle.

2. Description of the Related Art

One example of the above-described article transport facility is disclosed in JP 2010-262594A (Patent Document 1). According to the article transport facility disclosed in Patent Document 1, a traveling path includes a first path (a first merging path 27 and a post-merging path 29), and a second path (a second merging path 28) that merges with the first path at a connection position (a merging point 23) of the first path. An antenna 30 is provided along the first path. The management apparatus (a management means 24) is configured to recognize the presence of the article transport vehicle on the first path by detecting the article transport vehicle using the antenna 30.

SUMMARY OF THE INVENTION

In the above-described article transport facility according to Patent Document 1, the antenna 30 is continuously provided along the first path. The possibility of a failure occurring in the antenna 30 increases as the length of the first path increases and the installation length of the antenna 30 increases. Also, in a case where the antenna 30 is continuously provided as described above, if a plurality of article transport vehicles enter a management area, it is difficult to determine which article transport vehicle out of the plurality of article transport vehicles is the leading article transport vehicle, and it is necessary to take measures to discern the leading article transport vehicle out of the plurality of article transport vehicles that have entered the management area.

Therefore, it is desirable to realize an article transport facility in which a failure is less likely to occur regardless of the length of the management area, and that makes it easier to manage a plurality of article transport vehicles.

An article transport facility according to the present disclosure includes: article transport vehicles configured to travel along a travelling path; and a management apparatus configured to manage the article transport vehicles.

The travelling path includes a first path and a second path that branches off from or merges with the first path at a connection position of the first path, a management area and a check area are provided for the first path, the management area includes a section from the connection position to a position that is at a first preset distance upstream of the connection position, and a section from the connection position to a position that is at a second preset distance downstream of the connection position, the check area includes a section from a preset position to a position that is at a fourth preset distance upstream of the preset position, the preset position being a position that is at a third preset distance upstream of the connection position of the first path, each transport vehicle includes a transport vehicle detection unit configured to detect that another article transport vehicle is present on the travelling path at a position that is downstream of the article transport vehicle, a communication unit configured to communicate information to and from the management apparatus, and a control unit, and in a state where an article transport vehicle that includes the control unit is located in the check area, the control unit determines whether or not the article transport vehicle is in a leading state where no other article transport vehicle is present forward of the article transport vehicle in the check area, based on detection information detected by the transport vehicle detection unit, and if the article transport vehicle is in the leading state, the control unit transmits permission request information for requesting permission to pass through the management area, from the communication unit to the management apparatus, and if the article transport vehicle is not in the leading state, the control unit does not transmit the permission request information.

With this configuration, the management apparatus can recognize the presence of an article transport vehicle on the first path based on the permission request information transmitted from the article transport vehicle. Therefore, it is unnecessary to provide sensors for detecting the article transport vehicles along the first path, and it is possible to eliminate the possibility of a failure occurring in the sensors.

Also, when an article transport vehicle enters the check area, if the article transport vehicle is the leading vehicle in the check area, the article transport vehicle transmits permission request information. However, when an article transport vehicle enters the check area, if the article transport vehicle is not the leading vehicle in the check area, the article transport vehicle does not transmit permission request information. In short, even if a plurality of article transport vehicles are present in the check area, only one vehicle, which is the leading vehicle, transmits permission request information. Therefore, an article transport vehicle that has transmitted permission request information to the management apparatus is always the leading article transport vehicle, and the management apparatus can easily recognize the leading article transport vehicle.

DETAILED DESCRIPTION OF PREFERRED EMBODIMENTS

1. Embodiment

The following describes an embodiment of an article transport facility with reference to the drawings.

Figure 1:
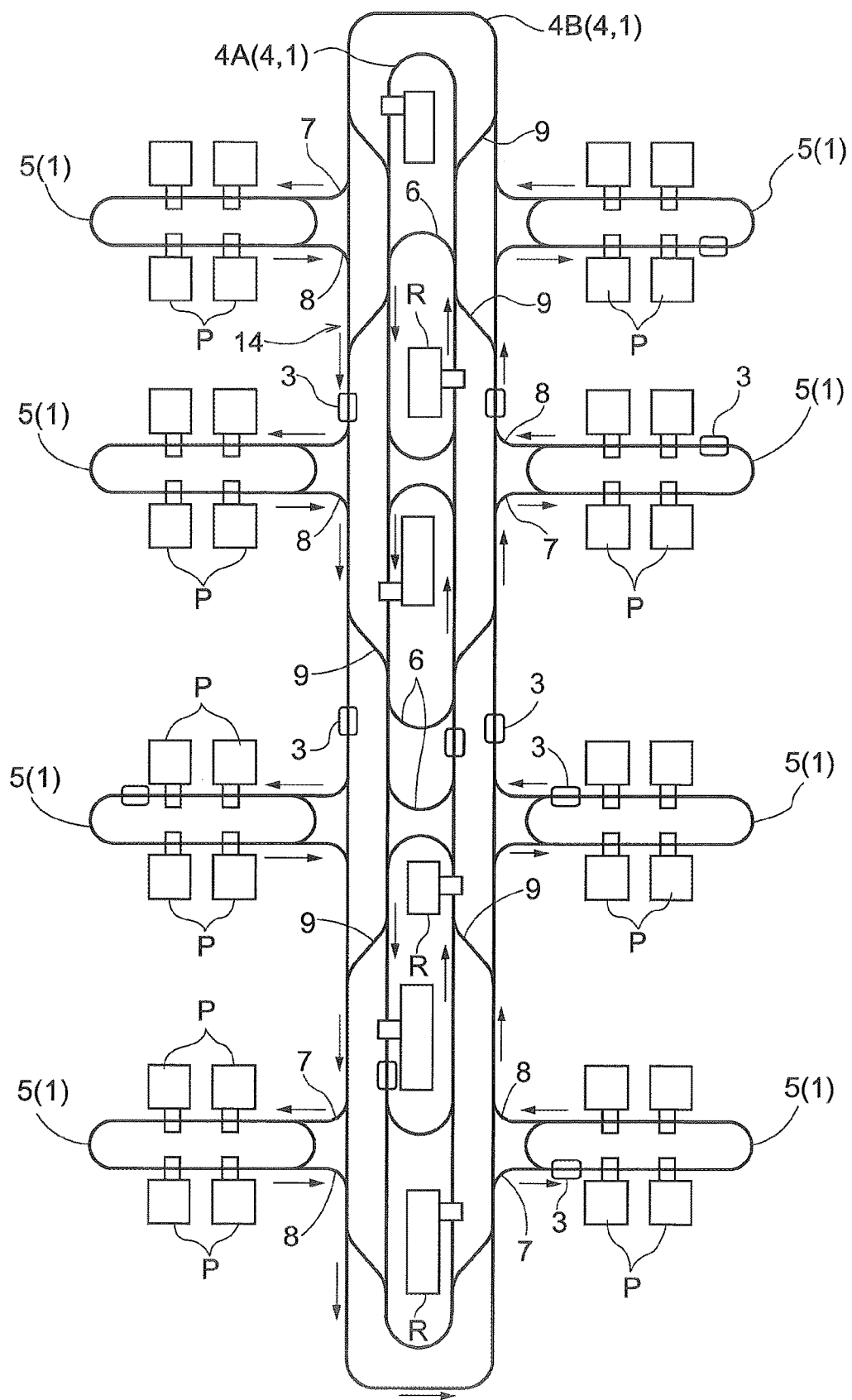
FIG. 1 is a plan view of an article transport facility.
Figure 2:
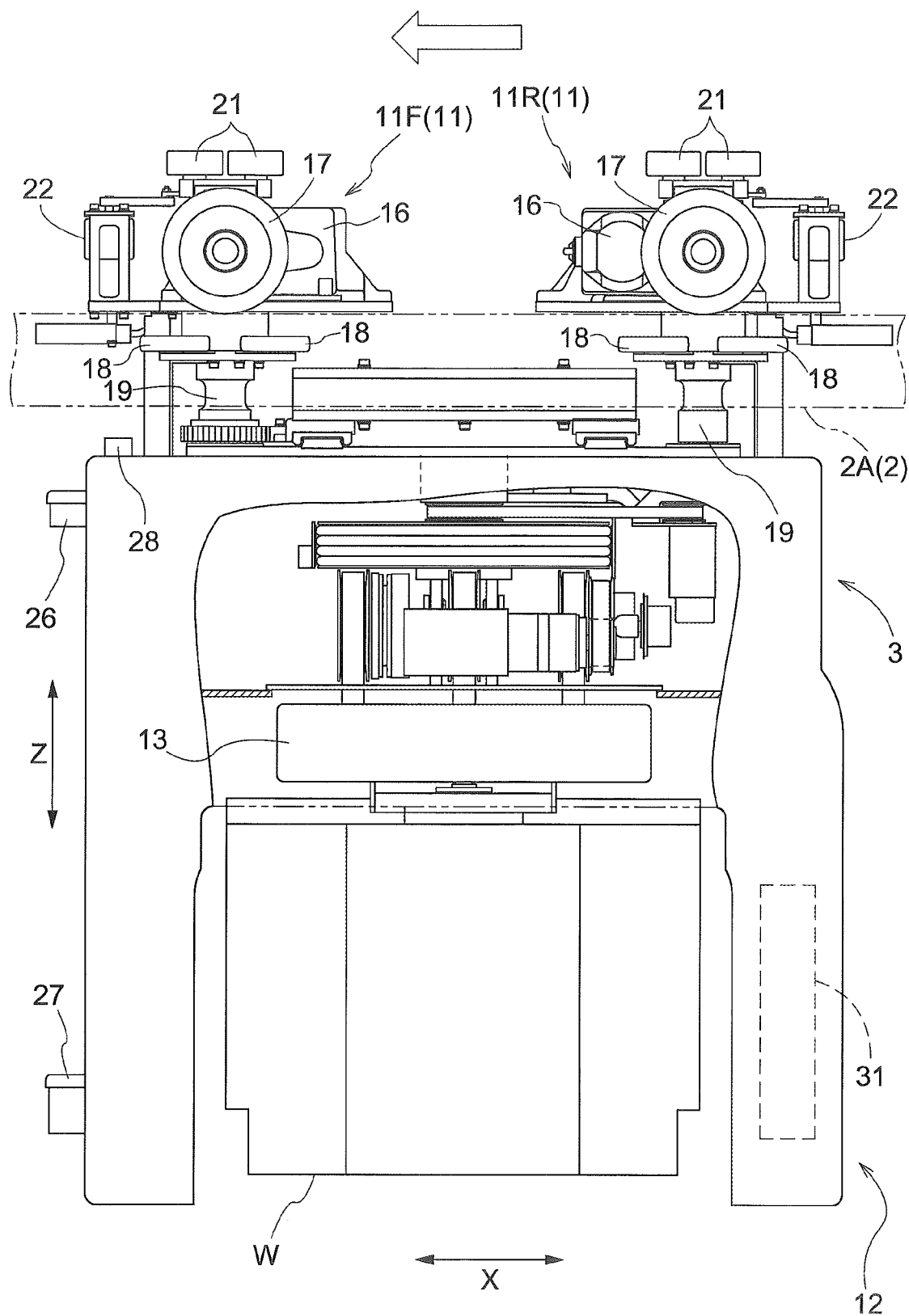
FIG. 2 is a side view of an article transport vehicle.
Figure 3:
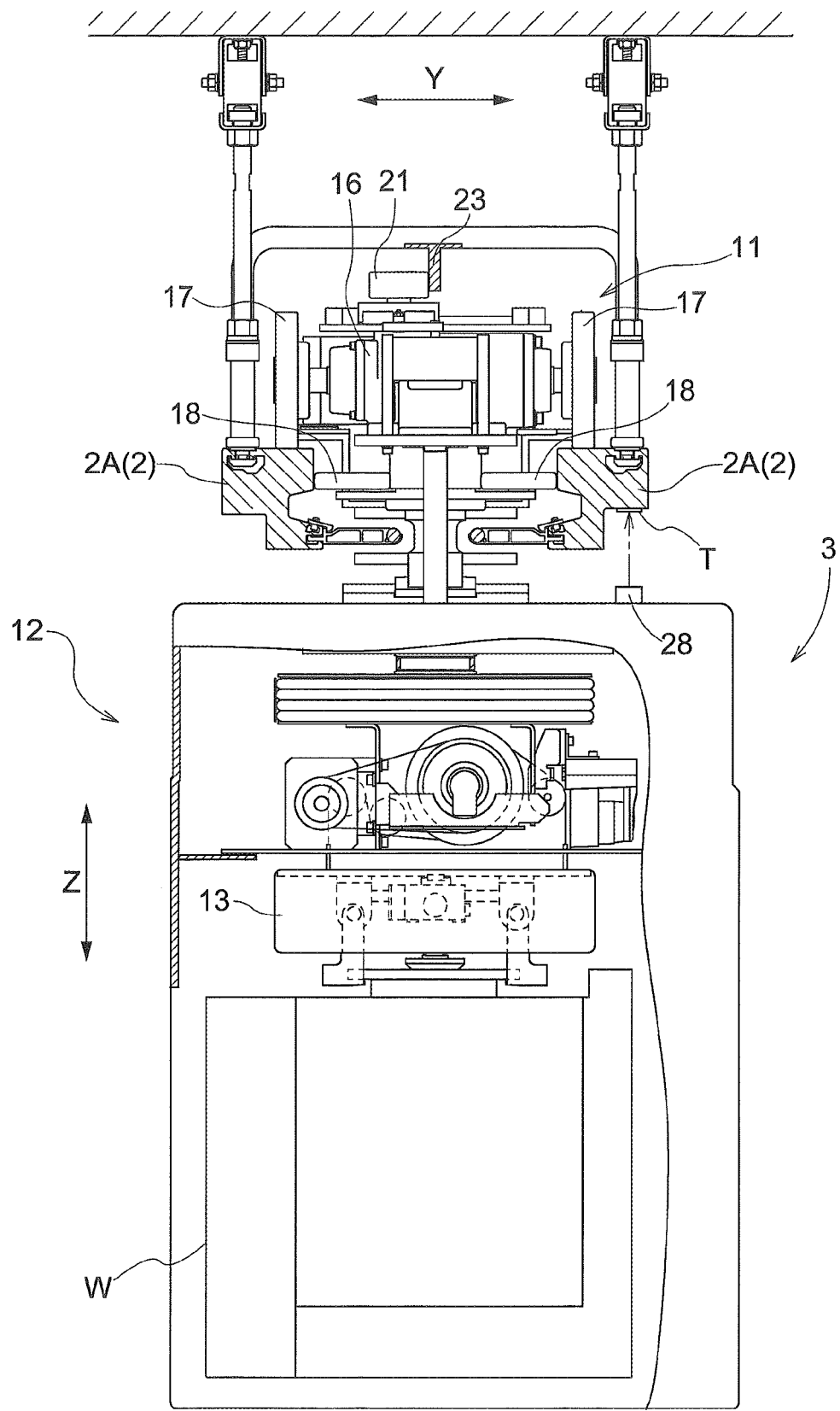
FIG. 3 is a front view of the article transport vehicle.

As shown in FIGS. 1 to 3, an article transport facility includes travelling rails 2 that are provided along a travelling path 1, and article transport vehicles 3 that travel on the travelling rails 2 along the travelling path 1. The travelling rails 2 are constituted by a pair of left and right rail portions 2A. Note that, in the present embodiment each article transport vehicle 3 transports an FOUP (Front Opening Unified Pod), in which a semiconductor substrate is housed, as an article W.

As shown in FIG. 1, the travelling path 1 includes two main paths 4 and a plurality of sub paths 5 that each go through a plurality of article processing portions P. The two main paths 4 and the plurality of sub paths 5 each have a ring shape.

The two main paths 4 are provided so as to have a double-ring shape. The article transport vehicles 3 travel along these two ring-shaped main paths 4 in the same rotational direction (counterclockwise). In FIG. 1, the direction in which the article transport vehicles 3 travel is indicated by arrows.

Out of the two main paths 4, the inner main path 4 is referred to as a first main path 4A, and the outer main path 4 is referred to as a second main path 4B.

The first main path 4A is provided so as to go through a plurality of storage units R. The first main path 4A is used as an article transfer path on which the article transport vehicles 3 stop to transfer an article W to/from a storage unit R, and the second main path 4B is used as a continuous travelling path on which the article transport vehicles 3 continuously travel.

The travelling path 1 is provided with shortcut paths 6, branching paths 7, merging paths 8, and transit paths 9.

Each shortcut path 6 is connected to a pair of sections of the first main path 4A, the sections being parallel to each other, and extending straight. Each shortcut path 6 allows the article transport vehicles 3 to travel from one of a pair of straight sections of the first main path 4A to the other.

The branching paths 7 are connected to the second main path 4B and the sub paths 5, and allow the article transport vehicles 3 to travel from the second main path 4B to the sub paths 5. The merging paths 8 are connected to the sub paths 5 and the second main path 4B, and allow the article transport vehicles 3 to travel form the sub paths 5 to the second main path 4B.

The transit paths 9 are connected to the first main path 4A and the second main path 4B, and allow the article transport vehicles 3 to travel from the first main path 4A to the second main path 4B, or from the second main path 4B to the first main path 4A.

Next, the following describes the article transport vehicles 3. Note that a direction along the travelling path 1 is referred to as a path's lengthwise direction X, and a direction that is orthogonal to the path's lengthwise direction X when seen in a top-bottom direction Z is referred to as a path's widthwise direction Y. Also, regarding the travelling path 1, the travelling direction of the article transport vehicles 3 (the direction in which the article transport vehicles 3 travel) is referred to as a downstream direction, and the opposite direction is referred to as an upstream direction.

For example, when an article transport vehicle 3 travels along a straight section of the travelling path 1, the front-rear direction of the article transport vehicle 3 is the same as the path's lengthwise direction X of the travelling path 1, and the left-right direction of the article transport vehicle 3 is the same as the path's widthwise direction Y of the travelling path 1. The path's widthwise direction Y is a width direction that intersects the travelling path 1.

As shown in FIGS. 2 and 3, each article transport vehicle 3 includes travelling units 11 that travel on the travelling rails 2 that are suspended from and supported by a ceiling, along the travelling rails 2, and a main body 12 that is located below the travelling rails 2 and is suspended from and supported by the travelling units 11. The main body 12 is provided with a supporting mechanism 13 that can be raised and lowered, and supports an article W that is in a suspended state.

A first travelling unit 11F and a second travelling unit 11R, which are lined up in the front-rear direction of the article transport vehicle 3, are provided as the travelling units 11.

The first travelling unit 11F is provided with a pair of left and right travelling wheels 17 that are driven and rotated by a first motor 16, which is an electric motor. The pair of left and right travelling wheels 17 are installed to the first travelling unit 11F so as to rotate on the upper surfaces of the travelling rails 2 (the pair of left and right rail portions 2A).

The first travelling unit 11F is also provided with pairs of left and right guide wheels 18 that are rotatable about a vertical axis that extends in the top-bottom direction of the vehicle body (about a top-bottom axis). The pairs of left and right guide wheels 18 are installed to the first travelling unit 11F so as to be located between the pair of left and right rail portions 2A and so as to rotate on side surfaces of the pair of left and right rail portions 2A, the side surfaces facing each other. Note that two pairs of left and right guide wheels 18 are installed to the first travelling unit 11F in a state of being lined up in the front-rear direction.

As with the first travelling unit 11F, the second travelling unit 11R is provided with one pair of left and right travelling wheels 17 and two pairs of left and right guide wheels 18.

The first travelling unit 11F and the second travelling unit 11R are each provided with a coupling shaft 19 that protrudes downward from lower ends of the travelling wheels 17.

The coupling shaft 19 of the first travelling unit 11F and the main body 12 are coupled to each other so as to be rotatable relative to each other about a vertical axis that extends in the top-bottom direction Z. The coupling shaft 19 of the second travelling unit 11R and the main body 12 are coupled to each other so as to be rotatable relative to each other about a vertical axis that extends in the top-bottom direction Z.

While the guide wheels 18 of the first travelling unit 11F and the second travelling unit 11R are guided by the pair of travelling rails 2 so that the position of the article transport vehicle 3 in the path's widthwise direction Y is restricted, the travelling wheels 17 of the first travelling unit 11F and the second travelling unit 11R are driven and rotated by the first motor 16, and thus the article transport vehicle 3 travels along the travelling path 1.

Also, the first travelling unit 11F and the second travelling unit 11R swing about vertical axes, relative to the main body 12, and thus the article transport vehicle 3 can travel along the travelling path 1 even if the travelling path 1 is arc-shaped.

As shown in FIG. 2, the first travelling unit 11F is provided with a pair of front and rear guide support wheels 21 that rotate about a vertical axis that extends in the top-bottom direction of the vehicle body (about a top-bottom axis), and a second motor 22 that moves the pair of front and rear guide support wheels 21 together in the left-right direction. The pair of front and rear guide support wheels 21 and the second motor 22 are installed to the first travelling unit 11F so as to be located above the travelling wheels 17.

As with the first travelling unit 11F, the second travelling unit 11R is provided with a pair of front and rear guide support wheels 21 and a second motor 22.

Figure 4:
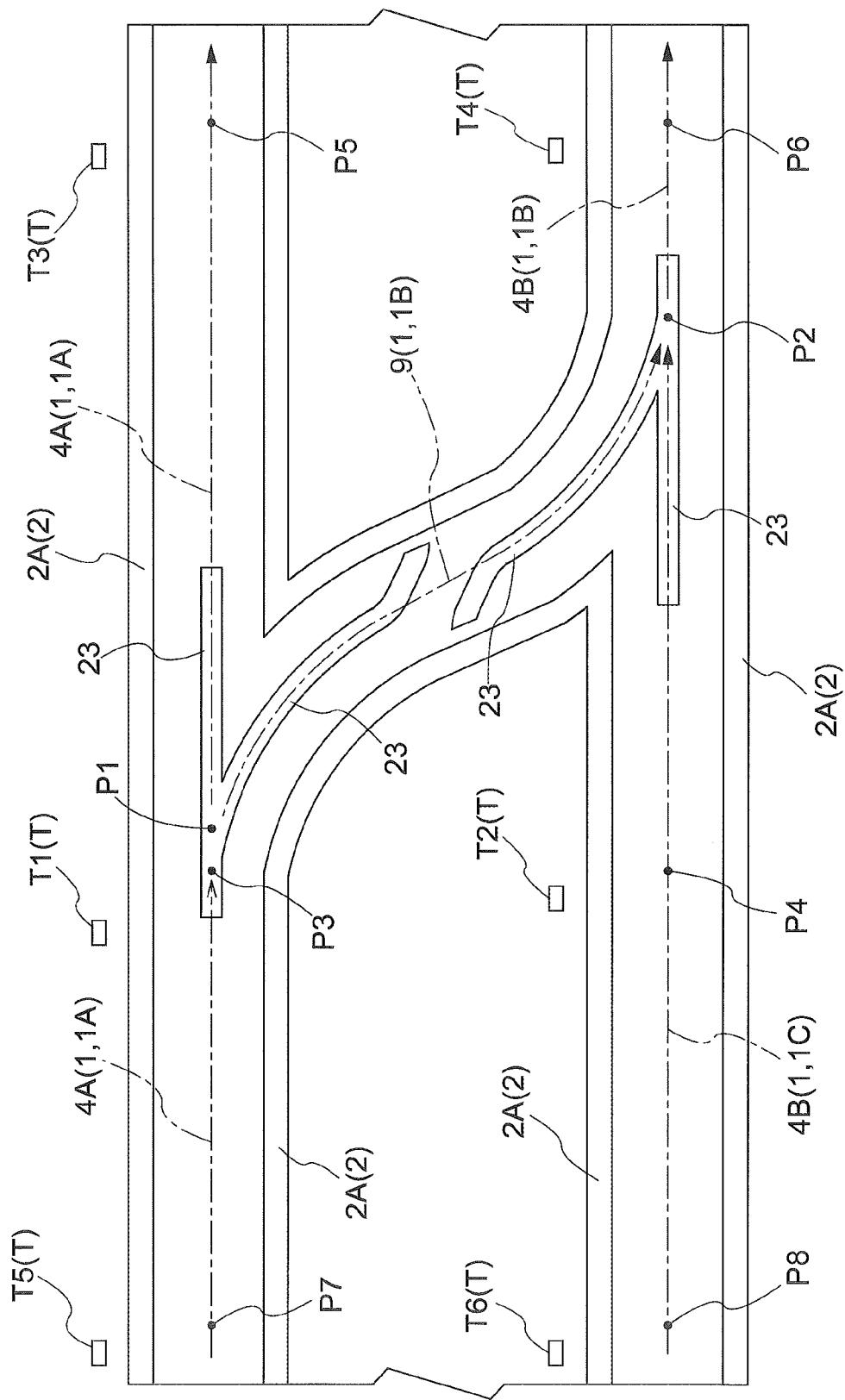
FIG. 4 is a plan view showing a first path, a second path, and a third path.

As shown in FIG. 4, guide rails 23 that guide the guide support wheels 21 are provided in a connection area in which two paths included in the travelling path 1 are connected to each other. As shown in FIG. 3, each guide rail 23 is provided so as to be located above the travelling rails 2 and above the travelling wheels 17 that rotate on the travelling rails 2, at a midpoint between the pair of left and right travelling rails 2 when seen in the top-bottom direction Z.

As shown in FIGS. 2 and 3, as a result of being driven by the second motor 22, the first travelling unit 11F moves the pair of front and rear guide support wheels 21 to right guide positions and left guide positions. The right guide positions are positions at which the pair of front and rear guide support wheels 21 are located on the right side of the center point of the first travelling unit 11F in the left-right direction, and at which the guide support wheels 21 abut against a guide rail 23 from the right side. The left guide positions are positions at which the pair of front and rear guide support wheels 21 are located on the left side of the center point of the first travelling unit 11F in the left-right direction, and at which the guide support wheels 21 abut against a guide rail 23 from the left side.

As with the first travelling unit 11F, as a result of being driven by the second motor 22, the second travelling unit 11R moves the pair of front and rear guide support wheels 21 to right guide positions and left guide positions.

The pair of front and rear guide support wheels 21 provided for the first travelling unit 11F and the pair of front and rear guide support wheels 21 provided for the second travelling unit 11R move to the same guide positions in synchronization with each other. The pair of left and right guide support wheels 21 are restricted by a restriction unit (not shown) from moving further to the right by the right guide positions or further to the left from the left guide positions. Therefore, for example, even if the pair of front and rear guide support wheels 21 located at the right guide positions are pressed to the right by the guide rails 23, the pair of front and rear guide support wheels 21 are kept at the right guide positions due to being restricted by the restriction unit. However, if the pair of front and rear guide support wheels 21 located at the right guide positions are pressed to the left by the guide rails 23, the pair of left and right guide support wheels 21 move to the left guide positions.

Figure 5:
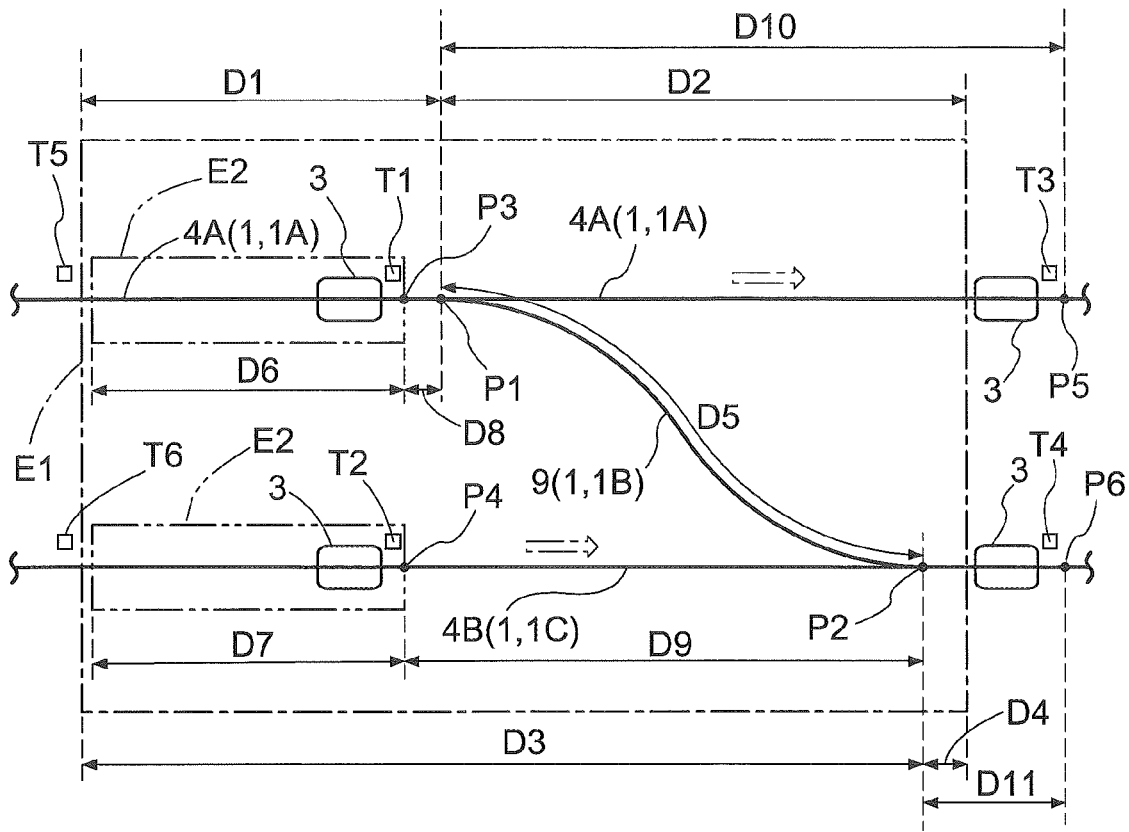
FIG. 5 is a plan view showing a management area and a check area.

As shown in FIGS. 4 and 5, the travelling path 1 includes a first path 1A, a second path 1B, and a third path 1C. The second path 1B branches off from the first path 1A at a branching position P1 (a connection position). The third path 1C merges with the second path 1B at a merging position P2 on the second path 1B. Specifically, the branching position P1 is provided at a midpoint of the first path 1A, and the upstream end of the second path 1B is connected to the branching position P1. The merging position P2 is provided at a midpoint of the second path 1B, and the downstream end of the third path 1C is connected to the merging position P2.

A management area E1 and check areas E2 are provided for the travelling path 1.

The management area E1 includes a section of the first path 1A from the branching position P1 to a position that is at a first area distance D1 (a first preset distance) upstream of the branching position P1, a section of the first path 1A from the branching position P1 to a position that is at a second area distance D2 (a second preset distance) downstream of the branching position P1, a section of the second path 1B from the branching position P1 to a position that is at a distance (an eighth preset distance) downstream of the branching position P1, the distance being obtained by adding a fourth area distance D4 to a fifth area distance D5, and a section of the third path 1C from the merging position P2 to a position that is at a third area distance D3 upstream of the merging position P2. The eighth preset distance (the fifth area distance D5+fourth area distance D4) is longer than the distance from the branching position P1 to the merging position P2 along the second path 1B (the fifth area distance D5).

A first stop position P3 (a preset position, a stop position) is provided for the first path 1A at a position that is upstream of the branching position P1 by a first separation distance D8 (a third preset distance, a fifth preset distance). A second stop position P4 is provided for the third path 1C at a position that is upstream of the merging position P2 by a second separation distance D9.

A first passing position P5 is provided for the first path 1A at a position that is downstream of the branching position P1 by a third separation distance D10 (a sixth preset distance). A second passing position P6 is provided for the second path 1B at a position that is downstream of the branching position P1 by a distance (a seventh preset distance) that is obtained by adding a fourth separation distance D11 to the fifth area distance D5.

The sixth preset distance (the third separation distance D10) is longer than the second preset distance (second area distance D2). The seventh preset distance (the fifth area distance D5+the fourth separation distance D11) is longer than the eighth preset distance (the fifth area distance D5+the fourth area distance D4).

As described above, the position that is upstream of the branching position P1 of the first path 1A by the first separation distance D8 (the third preset distance) is the first stop position P3 (the preset position), and the position that is upstream of the merging position P2 of the third path 1C by the second separation distance D9 is the second stop position P4.

The check area E2 includes a section from the first stop position P3 to a position that is at a sixth area distance D6 (a fourth preset distance) upstream of the first stop position P3, and a section from the second stop position P4 to a position that is at a seventh area distance D7 upstream of the second stop position P4. Note that the third preset distance (the first separation distance D8) is equal to the fifth preset distance (the first separation distance D8). Therefore, the fifth preset distance (the first separation distance D8) is shorter than a distance that is obtained by adding the fourth preset distance (the sixth area distance D6) to the third preset distance (the first separation distance D8).

Note that an article transport vehicle 3 that is located at the first stop position P3 is located at the downstream end of the first path 1A in the check area E2 thereof. An article transport vehicle 3 that is located at the second stop position P4 is located at the downstream end of the third path 1C in the check area E2 thereof. An article transport vehicle 3 that is located at the first passing position P5 is located downstream of the management area E1 on the first path 1A. An article transport vehicle 3 that is located at the second passing position P6 is located downstream of the management area E1 on the second path 1B.

As shown in FIG. 4, out of the first main path 4A, the second main path 4B, and the transit path 9 (the transit path 9 that allows an article transport vehicle 3 to travel from the first main path 4A to the second main path 4B), the first main path 4A serves as the first path 1A, the transit path 9 and a downstream section of the second main path 4B with respect to the merging position P2 serve as the second path 1B, and an upstream section of the second main path 4B with respect to the merging position P2 serves as the third path 1C.

Next, the following describes the management area E1, the check area E2, the stop positions, and the passing positions, based on the first main path 4A, the second main path 4B, and the transit path 9.

The first stop position P3 is provided for the first main path 4A at a position that is upstream of the branching position P1 by the first separation distance D8. The second stop position P4 is provided for the second main path 4B at a position that is upstream of the merging position P2 by the second separation distance D9.

The first passing position P5 is provided for the first main path 4A at a position that is downstream of the branching position P1 by the third separation distance D10. The second passing position P6 is provided for the second main path 4B at a position that is downstream of the merging position P2 by the fourth separation distance D11.

The management area E1 includes a section of the first main path 4A from the branching position P1 to a position that is at the first area distance D1 upstream of the branching position P1, a section of the first main path 4A from the branching position P1 to a position that is at the second area distance D2 downstream of the branching position P1, a section of the second main path 4B from the merging position P2 to a position that is at the third area distance D3 upstream of the merging position P2, a section of the second main path 4B from the merging position P2 to a position that is at the fourth area distance D4 downstream of the merging position P2, and the entirety of the transit path 9.

The check area E2 includes a section of the first main path 4A from the first stop position P3 to a position that is at the sixth area distance D6 upstream of the first stop position P3, and a section of the second main path 4B from the second stop position P4 to a position that is at the seventh area distance D7 upstream of the second stop position P4.

Figure 6:
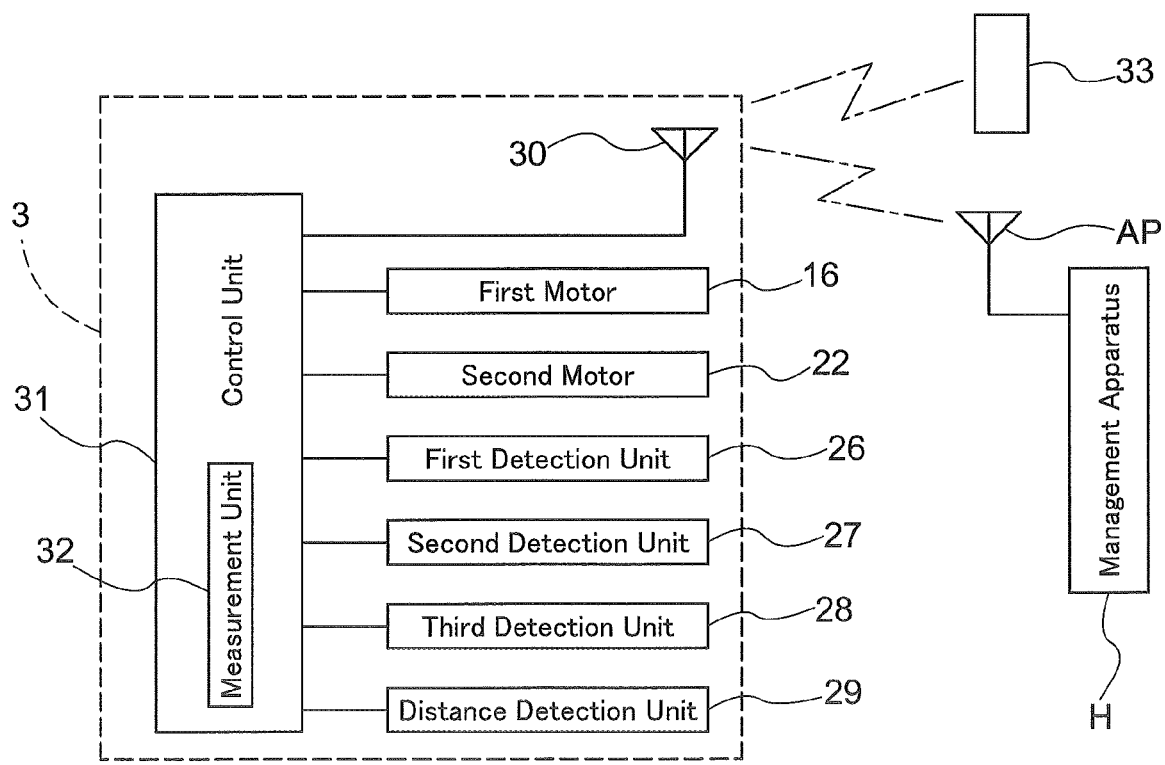
FIG. 6 is a control block diagram.

As shown in FIGS. 2 and 6, each article transport vehicle 3 includes a first detection unit 26, a second detection unit 27, a third detection unit 28, a distance detection unit 29, a communication unit 30, and a control unit 31.

The first detection unit 26 detects an article transport vehicle 3 that is located forward of the article transport vehicle 3, and detects the distance to the detected article transport vehicle 3. Note that the first detection unit 26 is equivalent to the transport vehicle detection unit that detects the presence of another article transport vehicle 3 on the travelling path 1 at a position that is downstream of the article transport vehicle 3. The second detection unit 27 detects an obstacle that is located forward of the article transport vehicle 3, and detects the distance to the detected obstacle.

The third detection unit 28 is formed using a two-dimensional code reader, and has the function of reading a two-dimensional code such as a barcode on a detection target member T, and the function of detecting the presence or absence of a detection target member T. The third detection unit 28 is equivalent to the passing detection unit that detects that an article transport vehicle 3 is located at the first passing position P5 and the second passing position P6.

The distance detection unit 29 is formed using a rotary encoder that detects the amount of rotation of the travelling wheels 17, and is configured to be able to detect the travelling distance of the article transport vehicle 3. Note that the distance detection unit 29 and the third detection unit 28 constitute an entrance detection unit that detects that a vehicle 3A, which is the article transport vehicle 3 corresponding thereto, has entered a check area E2.

The control unit 31 controls the article transport vehicle 3 based on detection information detected by each detection unit and information received by the communication unit 30. The control unit 31 has the function of a measurement unit 32 that measures elapsed time. In this way, the control unit 31 has the function of the measurement unit 32, and thus the article transport vehicle 3 includes the measurement unit 32.

The communication unit 30 is for communicating (transmitting and receiving) information to/from a management apparatus H and a communication apparatus 33.

Specifically, the article transport facility includes the management apparatus H that manages article transport vehicles 3 and a plurality of access points AP. In the present embodiment, the management apparatus H is provided on a floor surface, and the plurality of access points AP are provided on the ceiling. In this way, the management apparatus H and the plurality of access points AP are provided at fixed positions relative to the travelling path 1. The communication unit 30 is configured to be able to perform wireless communication with the access points AP, and the communication unit 30 communicates information to and from the management apparatus H via the access points AP.

The article transport facility also includes the communication apparatus 33, which can be operated by an operator. The communication apparatus 33 is configured to be able to transmit stop information and stop cancellation information to the communication unit 30 of the article transport vehicle 3, and the communication unit 30 is configured to be able to receive stop information and stop cancellation information transmitted from the communication apparatus 33.

A plurality of detection target members T are provided along the travelling path 1. Each detection target member T has address information that indicates the position of the detection target member T. As shown in FIG. 4, detection target members T are provided at the first stop position P3, the second stop position P4, the first passing position P5, and the second passing position P6. Detection target members T are also provided at a first preparation position P7 that is provided upstream of the management area E1 on the first main path 4A, and at a second preparation position P8 that is provided upstream of the management area E1 on the second main path 4B.

The detection target member T provided at the first stop position P3 is referred to as a first detection target member T1, the detection target member T provided at the second stop position P4 is referred to as a second detection target member T2, the detection target member T provided at the first passing position P5 is referred to as a third detection target member T3, the detection target member T provided at the second passing position P6 is referred to as a fourth detection target member T4, the detection target member T provided at the first preparation position P7 is referred to as a fifth detection target member T5, and the detection target member T provided at the second preparation position P8 is referred to as a sixth detection target member T6.

The control unit 31 detects the position of the article transport vehicle 3 on the travelling path 1 based on address information that is indicated by the detection target members T detected by the third detection unit 28, and distance information detected by the distance detection unit 29 (distance information that indicates a traveling distance over which the article transport vehicle 3 has travelled since a detection target member T was detected).

Next, the following describes control that is executed by the control unit 31 of each article transport vehicle 3 and control that is executed by the management apparatus H (control that is executed to manage article transport vehicles 3), based on an example in which article transport vehicles 3 travel on the first main path 4A, the second main path 4B, and the transit path 9 as shown in FIG. 5. Note that the article transport vehicle 3 that includes the control unit 31 that is described may be referred to as the vehicle 3A, and an article transport vehicle 3 that has stopped on the travelling path due to a failure may be referred to as a disabled vehicle 3B.

The control unit 31 executes switching control and approaching stop control.

Figure 7:
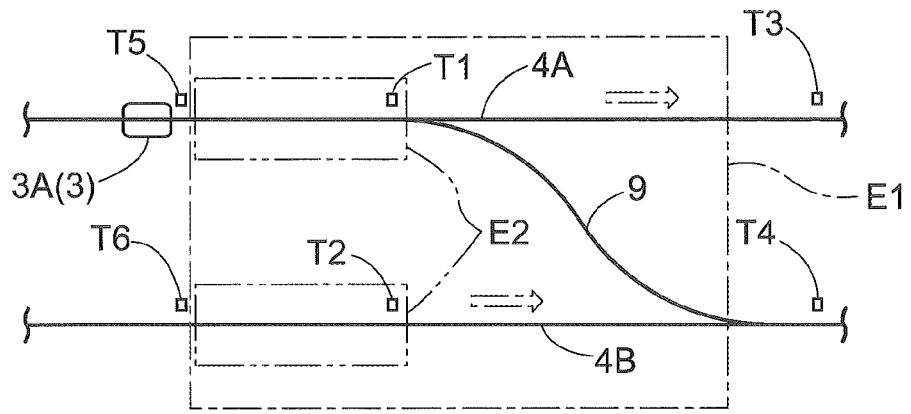
FIG. 7 shows a state where the article transport vehicle is located at a first preparation position.

Switching control is executed if, as shown in FIG. 7, the article transport vehicle 3 has reached the first preparation position P7 that is provided upstream of the branching position P1 on the first main path 4A, to control the operation of the second motor 22 to move the guide support wheels 21 to positions that correspond to the path that the article transport vehicle 3 is to travel.

Specifically, when the article transport vehicle 3 travels along the first main path 4A, the control unit 31 executes switching control upon the third detection unit 28 detecting the fifth detection target member T5. Then, as shown in FIG. 7, when the article transport vehicle 3 travels along the first main path 4A, if the article transport vehicle 3 is to travel straight along the first main path 4A (if the article transport vehicle 3 is to pass through the first stop position P3 and the first passing position P5), the control unit 31 executes switching control to move the guide support wheels 21 to the left (to the left guide positions), and if the article transport vehicle 3 is to travel from the first main path 4A to the transit path 9 (if the article transport vehicle 3 is to pass through the first stop position P3 and the second passing position P6), the control unit 31 executes switching control to move the guide support wheels 21 to the right (to the right guide positions).

Approaching stop control is executed if another article transport vehicle 3 has stopped at a position that is forward of the vehicle 3A, to stop the vehicle 3A at a position that is upstream of the other article transport vehicle 3.

Figure 15:
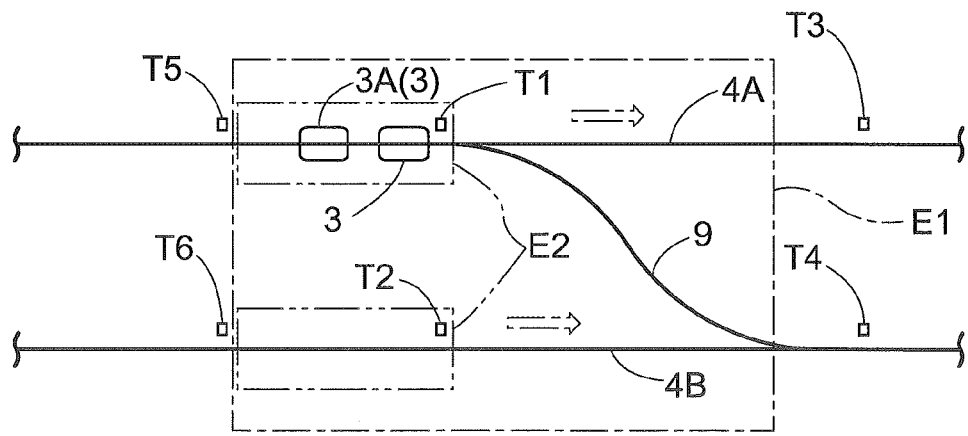
FIG. 15 shows a state where the article transport vehicle has stopped as a result of approaching stop control.

Specifically, as shown in FIG. 15, for example, when the vehicle 3A travels along the first main path 4A, if another article transport vehicle 3 has stopped at the first stop position P3 that is forward of the vehicle 3A, the first detection unit 26 of the vehicle 3A detects the other article transport vehicle 3, and upon the distance from the vehicle 3A to the other article transport vehicle 3 being smaller than or equal to a preset approach distance, the control unit 31 controls the first motor 16 based on the detection performed by the first detection unit 26, to stop the vehicle 3A at a position that is upstream of the article transport vehicle 3 by a preset distance.

If an obstacle such as a stopper plate 34 is located forward of the vehicle 3A, approaching stop control is executed to stop the vehicle 3A at a position that is upstream of the obstacle.

Figure 18:
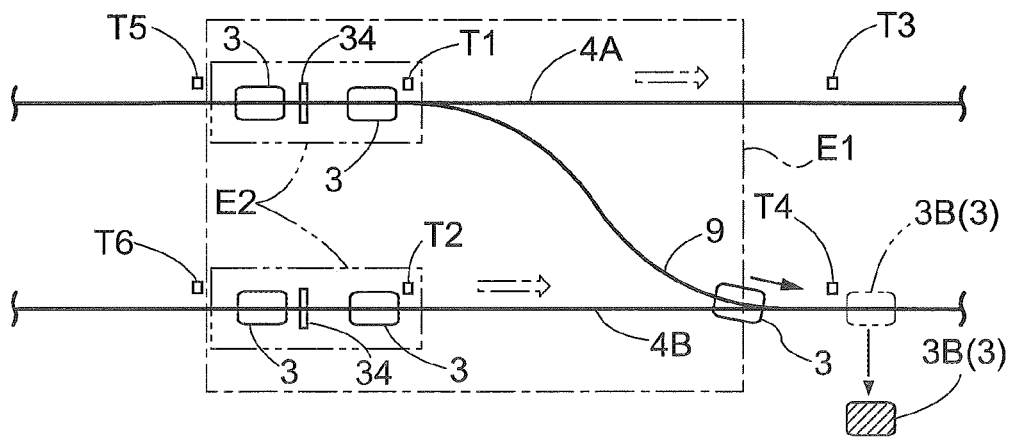
FIG. 18 shows a state where the disabled vehicle has been removed from the second main path.

Specifically, as shown in FIG. 18, if a stopper plate 34 is provided forward of the article transport vehicle 3, the second detection unit 27 of the vehicle 3A detects the stopper plate 34, and upon the distance from the vehicle 3A to the stopper plate 34 being smaller than or equal to a preset approach distance, the control unit 31 controls the first motor 16 based on the detection performed by the second detection unit 27, to stop the vehicle 3A at a position that is upstream of the stopper plate 34 by a preset distance. Note that, if a stopper plate 34 is provided at a distance that is smaller than or equal to the approach distance, from the vehicle 3A that has stopped, the vehicle 3A does not move forward as a result of approaching stop control, even if permission information has been received.

The control unit 31 also executes transmission control, passing control, and stop control.

After the vehicle 3A travelling along the first main path 4A has entered the check area E2, if a transmission condition is satisfied, the control unit 31 executes transmission control to transmit permission request information to the management apparatus H. The transmission condition is that another article transport vehicle 3 is not present in the check area E2 forward of the vehicle 3A.

The management apparatus H transmits permission information to the article transport vehicle 3 that is located in the check area E2 and that transmitted permission request information, according to the state of the article transport vehicle 3 in the management area E1. Specifically, if it has been determined that there is no article transport vehicle 3 travelling in the management area E1 based on permission information, the management apparatus H transmits permission information to the article transport vehicle 3 that is located in the check area E2 and that transmitted permission request information.

If the control unit 31 receives permission information before the vehicle 3A reaches the first stop position P3, the control unit 31 executes passing control to cause the vehicle 3A to pass through the check area E2 and the management area E1.

If the control unit 31 does not receive permission information before the vehicle 3A reaches the first stop position P3, the control unit 31 executes stop control to stop the vehicle 3A at the first stop position P3. If the control unit 31 receives permission information while the vehicle 3A is stopped at the first stop position P3, the control unit 31 executes passing control. The control unit 31 transmits passing information (passing completion information) to the management apparatus H while the vehicle 3A passes through the management area E1 as a result of passing control being executed.

After transmitting permission information (passing permission), the management apparatus H determines that the article transport vehicle 3 travelling based on the permission information is present in the management area E1 until the management apparatus H receives passing information.

Next, the following additionally describes transmission control, passing control, and stop control.

Figure 8:
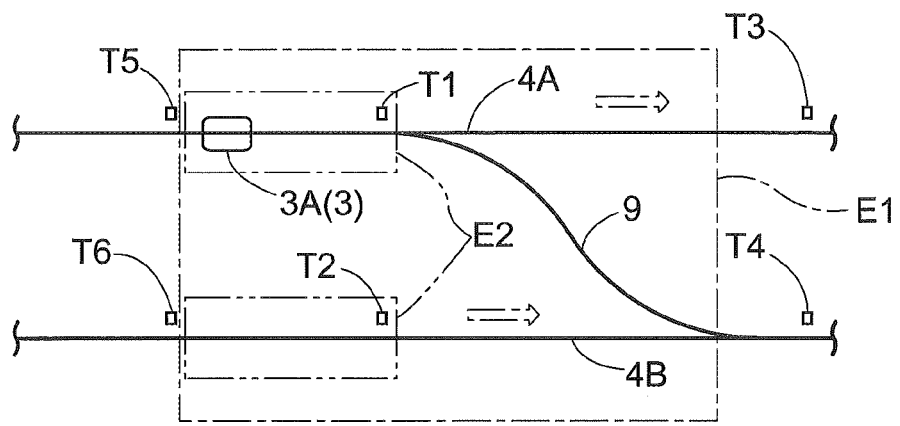
FIG. 8 shows a state where the article transport vehicle has entered the check area.

Transmission control is executed on the condition that the entrance detection unit detects that the vehicle 3A has entered the check area E2 and is in a leading state, as shown in FIG. 8, to transmit permission request information from the communication unit 30 to the management apparatus H.

Specifically, the article transport vehicle 3 enters the check area E2 as a result of travelling the preset distance from when the third detection unit 28 detects the fifth detection target member T5. That is, the entrance of the vehicle 3A into the check area E2 is detected as a result of the third detection unit 28 detecting the fifth detection target member T5 and the distance detection unit 29 detecting that the vehicle 3A has travelled the preset distance. Note that the third detection unit 28 and the distance detection unit 29 constitute the entrance detection unit that detects that the vehicle 3A has entered the check area E2.

Then, after the entrance of the vehicle 3A into the check area E2 is detected, if the first detection unit 26 does not detect another article transport vehicle 3 in the check area E2 forward of the vehicle 3A, the control unit 31 determines that the vehicle 3A is in a leading state, and if the first detection unit 26 detects another article transport vehicle 3 in the check area E2, the control unit 31 determines that the vehicle 3A is not in a leading state.

In this way, transmission control is executed if the vehicle 3A, which is the article transport vehicle 3 that includes the control unit 31, is located in the check area, to determine whether or not the vehicle 3A is in a leading state where no other transport vehicle 3 is in the check area E2, forward of the vehicle 3A, based on detection information obtained by the first detection unit 26. In transmission control, if the vehicle 3A is in a leading state, permission request information for requesting permission to pass through the management area E1 is transmitted from the communication unit 30 to the management apparatus H, and if the vehicle 3A is not in a leading state, permission request information is not transmitted.

Specifically, permission request information is transmitted in the following manner. In communication control, if the vehicle 3A is located in the check area E2 and is in a leading state, the control unit 31 transmits permission request information at preset time intervals (200 msec intervals in the present embodiment), measures the time elapsed since the first transmission of permission request information, and also transmits elapsed time information that indicates the elapsed time at the second and later transmissions of permission request information.

Also, in a state where the vehicle 3A is located in the check area E2, the control unit 31 transmits travel schedule information, which indicates whether the vehicle 3A is to travel along the first path 1A downstream from the branching position P1 (the connection position), or to travel along the second path 1B downstream from the branching position P1 (the connection position), from the communication unit 30 to the management apparatus H, together with permission request information. Note that information regarding the path that the vehicle 3A is entering (address information that indicates the first stop position P3 or the second stop position P4, and address information that indicates the first passing position P5 or the second passing position P6) is transmitted as the aforementioned travel schedule information.

When the management apparatus H transmits permission information to an article transport vehicle 3 that is located in the check area E2 and that has transmitted permission request information, according to the states of article transport vehicles 3 on both the first path 1A and the second path 1B, if there are a plurality of article transport vehicles 3 that are located in the check area E2 and that have transmitted permission request information, the management apparatus H preferentially transmits permission information to the article transport vehicle 3 whose elapsed time information indicates the longest elapsed time.

Figure 16:
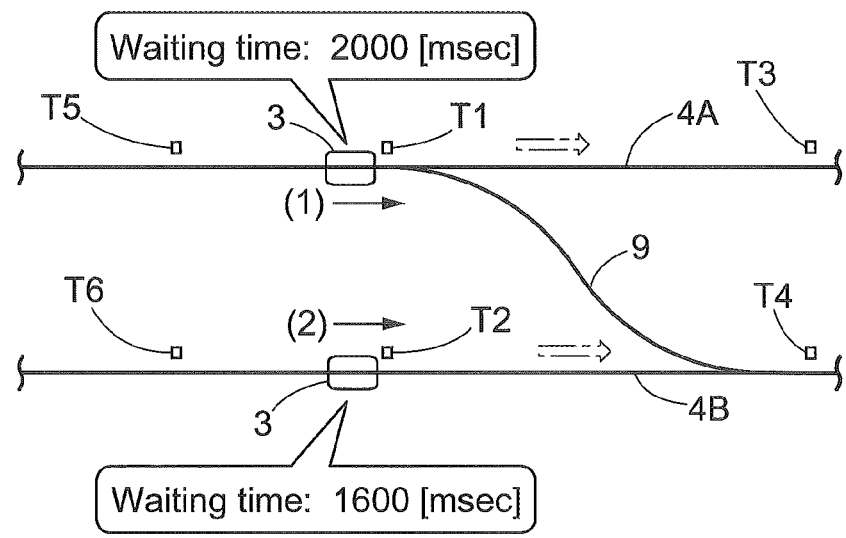
FIG. 16 shows a state where a plurality of article transport vehicles have stopped.

Specifically, as shown in FIG. 16, when the management apparatus H transmits permission information to an article transport vehicle 3, if an article transport vehicle 3 that has stopped at the first stop position P3 and whose elapsed time is A time (2000 msec) and an article transport vehicle 3 that has stopped at the second stop position P4 and whose elapsed time is B time (1600 msec) are present as article transport vehicles 3 that are located in the check area E2 and have transmitted permission request information, the management apparatus H transmits permission information to the article transport vehicle 3 that has stopped at the first stop position P3 and whose elapsed time is longer than that of the other.

Figure 9:
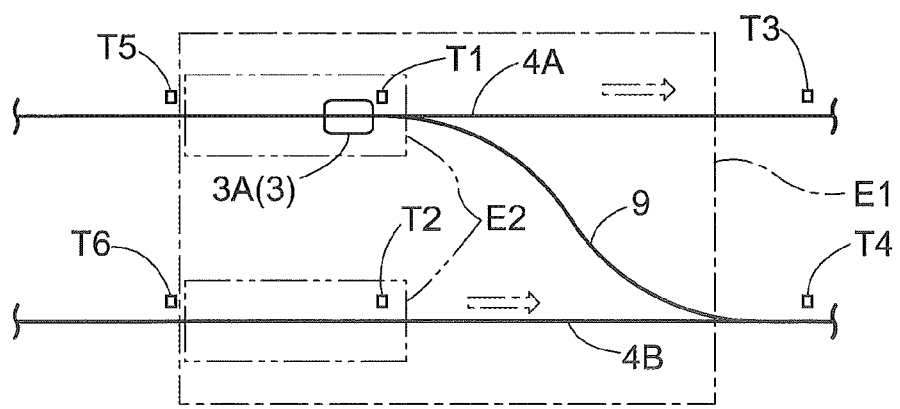
FIG. 9 shows a state where the article transport vehicle is located at a first stop position.
Figure 10:
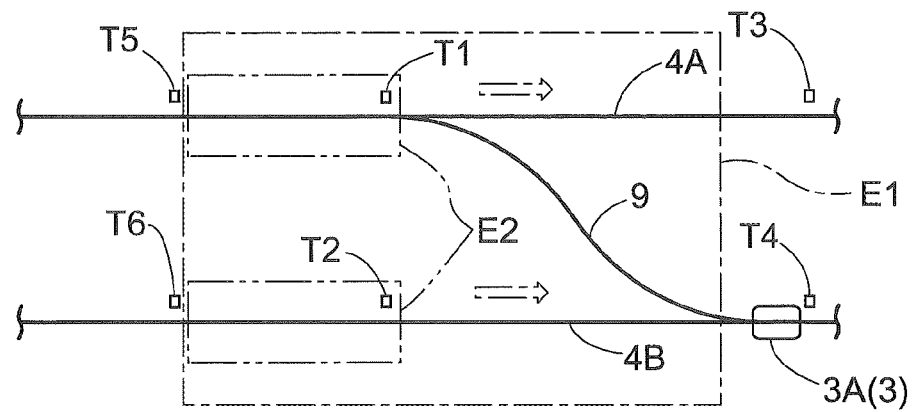
FIG. 10 shows a state where the article transport vehicle is located at a second passing position.
Figure 11:
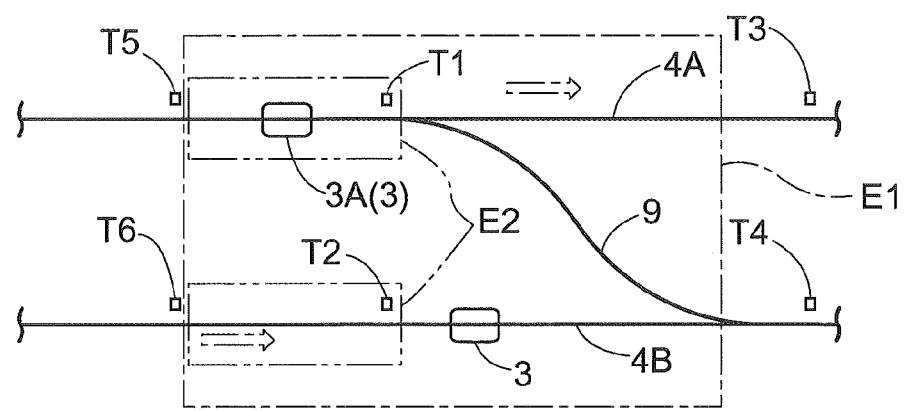
FIG. 11 shows a state where the article transport vehicle executes stop control.

As shown in FIGS. 8 to 10, passing control is executed if the vehicle 3A travelling along the first main path 4A receives permission information during a period from when the vehicle 3A enters the check area E2 to when the vehicle 3A reaches the first stop position P3, to cause the vehicle 3A to pass through the check area E2 and the management area E1. In other words, if the vehicle 3A receives permission information from the management apparatus H when the vehicle 3A travels in the check area E2 toward the first stop position P3 after transmitting permission request information, passing control is executed to cause the vehicle 3A to travel so that the vehicle 3A continues travelling and passes through the check area E2 and the management area E1.

Figure 12:
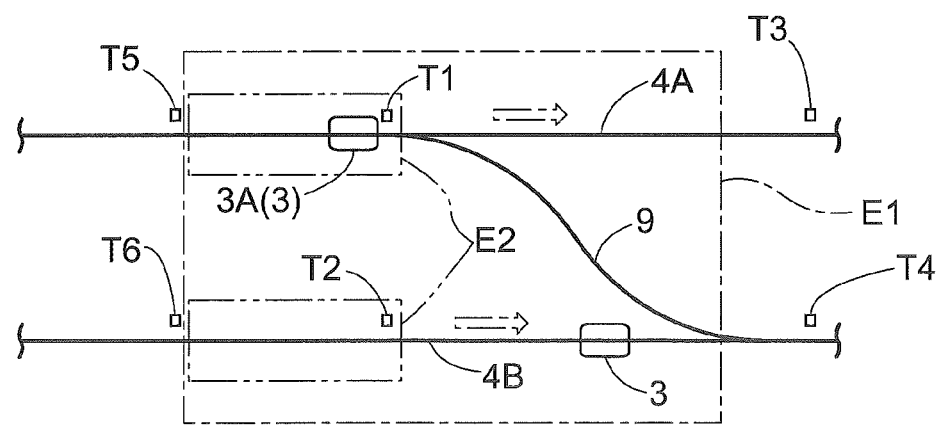
FIG. 12 shows a state where the article transport vehicle is located at the first stop position as a result of stop control.
Figure 13:
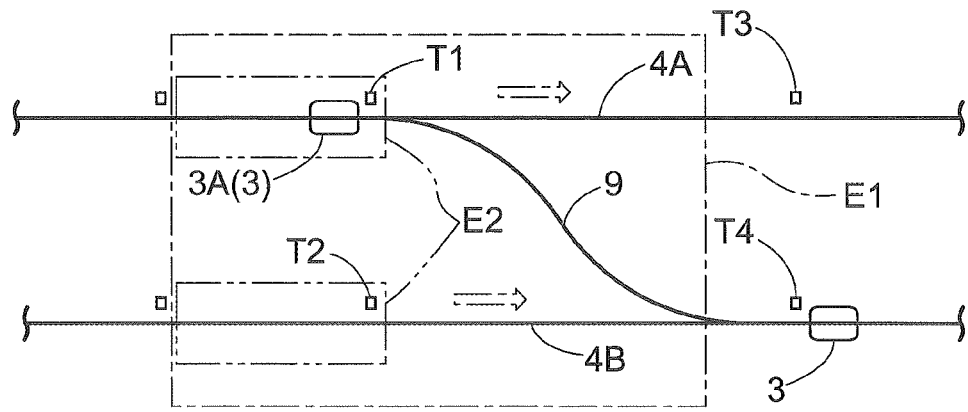
FIG. 13 shows a state where the article transport vehicle has stopped at the first stop position as a result of stop control.
Figure 14:
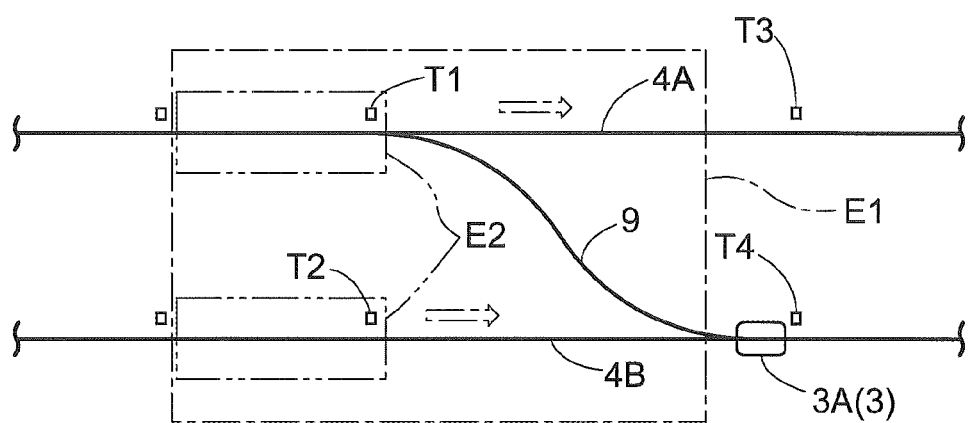
FIG. 14 shows a state where the article transport vehicle has travelled to a second stop position as a result of passing control.

Also, as shown in FIGS. 12 to 14, if the vehicle 3A receives permission information while the vehicle 3A is stopped at the first stop position P3, passing control is executed to cause the vehicle 3A to pass through the check area E2 and the management area E1.

Then, if the vehicle 3A passes through the management area E1 and reaches the first passing position P5 or the second passing position P6, passing control is executed to transmit passing information from the communication unit 30 to the management apparatus H, receive release information from the management apparatus H, and thereby delete the permission information.

Stop control is executed if the vehicle 3A travelling along the first main path 4A does not receive permission information before reaching the first stop position P3, to stop the vehicle 3A at the first stop position P3 as shown in FIG. 9. Stop control is also executed if the vehicle 3A travelling along the second main path 4B does not receive permission information before reaching the second stop position P4, to stop the vehicle 3A at the second stop position P4.

In this way, if the vehicle 3A receives permission information before reaching a stop position, or the vehicle 3A receives permission information while stopped at a stop position, the control unit 31 causes the vehicle 3A to pass through the check area E2 and the management area E1, and if the vehicle 3A does not receive permission information before reaching a stop position, the control unit 31 causes the vehicle 3A to stop at the stop position.

If the communication unit 30 receives stop information while the control unit 31 is executing approaching stop control, passing control, or stop control, the control unit 31 suspends the control that is being executed and brings the vehicle 3A into a forcibly stopped state to forcibly stop the vehicle 3A, and if the communication unit 30 receives stop cancellation information, the control unit 31 cancels the forcibly stopped state and executes the suspended control. That is, an operator can bring any article transport vehicle 3 into a forcibly stopped state by operating the communication apparatus 33 to transmit stop information.

Figure 17:
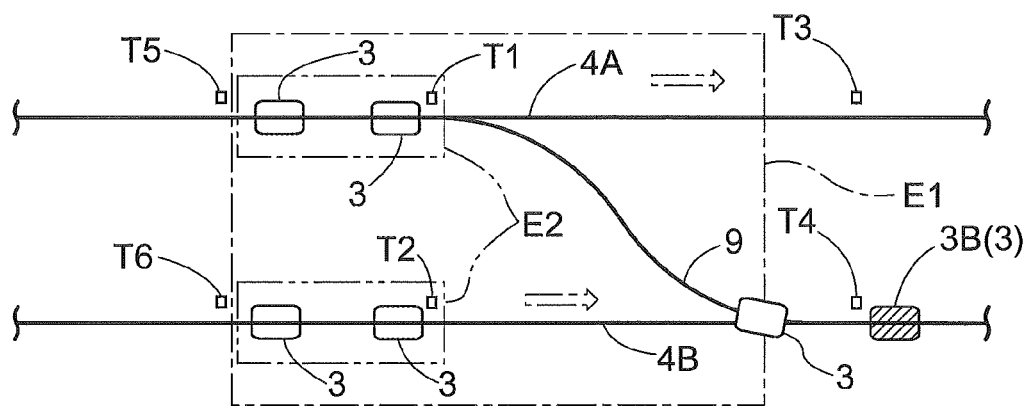
FIG. 17 shows a state where there is a disabled vehicle on a second main path.
Figure 19:
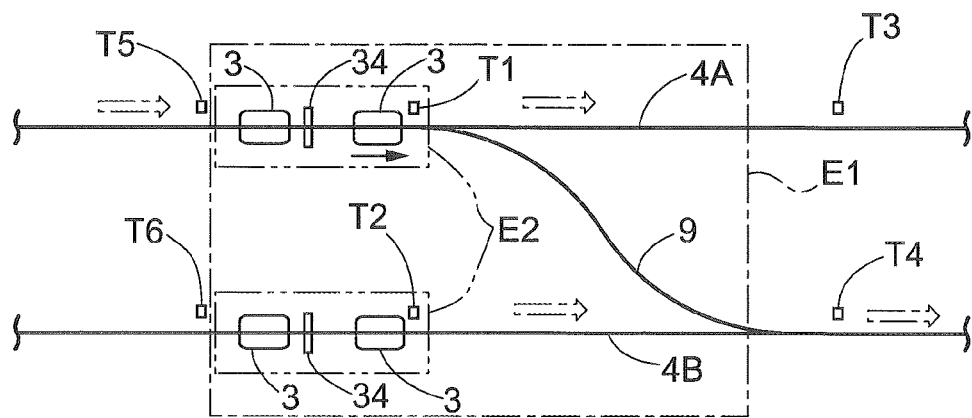
FIG. 19 shows a state where the disabled vehicle has been removed from the second main path.

The following describes a case in which the communication apparatus 33 is used to operate the article transport vehicles 3, with reference to FIGS. 17 to 19.

As shown in FIG. 17, the disabled vehicle 3B, which is a disabled article transport vehicle 3, has stopped at a position that is downstream of the management area E1. Also, another article transport vehicle 3, which has been travelling along the transit path 9 due to passing control being executed based on permission information, has stopped on the transit path 9 as a result of approaching stop control (emergency stop control). Also, other article transport vehicles 3 have stopped at the first stop position P3 and the second stop position P4 as a result of stop control. Other article transport vehicles 3 have stopped at positions that are upstream of the first stop position P3 and the second stop position P4 as a result of approaching stop control.

In this state, if an operator moves the disabled vehicle 3B downstream, article transport vehicles 3 that have stopped as a result of approaching stop control start travelling again, and there is the risk of the article transport vehicles 3 coming into contact with the operator.

Therefore, the operator operates the communication apparatus 33 to transmit stop information to article transport vehicles 3 that are located upstream of the disabled vehicle 3B (e.g. the article transport vehicle 3 that has been stopped on the transit path 9 as a result of approaching stop control) to forcibly stop these article transport vehicles 3, and then moves the disabled vehicle 3B downstream. Thus, it is possible to avoid the above-described risk of article transport vehicles 3 coming into contact with the operator.

Also, as shown in FIGS. 18 and 19, by placing stopper plates 34 at positions that are forward of article transport vehicles 3 (article transport vehicles 3 that have stopped on the first main path 4A and the second main path 4B as a result of approaching stop control), it is possible to keep the article transport vehicles 3 that have stopped as a result of approaching stop control in a stopped state even if an article transport vehicle 3 that is located forward thereof moves. Also, the operator can bring the article transport vehicles 3 that have stopped as a result of approaching stop control, into a forcibly stopped state by operating the communication apparatus 33, and thus can keep the article transport vehicles 3 in a stopped state in two ways at the same time.

Upon being operated to stop, the management apparatus H transmits inactivation information to all of the article transport vehicles 3 that are located on the travelling path 1, and discards permission information that has been transmitted to the article transport vehicles 3 in the management area E1.

If the communication unit 30 receives inactivation information while the control unit 31 of the article transport vehicle 3 is executing approaching stop control, passing control, or stop control, the control unit 31 suspends the control that is being executed and brings the article transport vehicle 3 into a waiting state.

Upon being operated to be activated, the management apparatus H transmits activation information to all of the article transport vehicles 3 on the travelling path 1.

If the communication unit 30 receives activation information, the control unit 31 of the article transport vehicle 3 cancels the waiting state and executes the suspended control. Also, the control unit 31 executes transmission control if the article transport vehicle 3 is located in a check area E2 and the transmission condition is satisfied.

The management apparatus H transmits permission information to only one of the article transport vehicles 3 that are located in the check areas E2 and that have transmitted permission request information, according to the states of the article transport vehicles 3 on both the first path 1A and the second path 1B.

The management apparatus H does not perform merging control, that is, does not transmit permission information to an article transport vehicle 3 that is travelling on a path that requires merge-travelling, until a preset first time has elapsed after activation.

That is, when the management apparatus H is to transmit permission information to an article transport vehicle 3 that is located in a check area E2 and that has transmitted permission request information, the management apparatus H does not transmit permission information to the article transport vehicle 3 if the travelling path indicated by the travel schedule information transmitted by the article transport vehicle 3 is a path that requires merge-travelling, and transmits permission information if the travelling path indicated by the travel schedule information is a path that does not require merge-travelling. Specifically, if the travel schedule information of an article transport vehicle 3 is address information that indicates the first stop position P3 and the first passing position P5, the travelling path indicated by the travel schedule information is a path that does not require merge-travelling, and therefore the management apparatus H transmits permission information to the article transport vehicle 3, whereas if the travel schedule information of an article transport vehicle 3 is address information that indicates the first stop position P3 and the second passing position P6, or address information that indicates the second stop position P4 and the second passing position P6, the travelling path indicated by the travel schedule information is a path that requires merge-travelling, and therefore the management apparatus H does not transmit permission information to the article transport vehicle 3.

Also, upon the preset first time elapsing after activation, the management apparatus H causes an article transport vehicle 3 that is to perform merge-travelling in an management area E1 as per passing control, to travel in the management area E1 at a low speed that is lower than a normal traveling speed, until a preset second time has elapsed.

Specifically, when the management apparatus H is to transmit permission information to an article transport vehicle 3 that is located in a check area E2 and that has transmitted permission request information, if the travelling path indicated by the travel schedule information transmitted by the article transport vehicle 3 is a path that requires merge-travelling, the management apparatus H transmits low-speed information together with permission information to the article transport vehicle 3, and if the travelling path indicated by the travel schedule information is a path that does not require merge-travelling, the management apparatus H transmits permission information but does not transmit low-speed information.

If the control unit 31 receives low-speed information together with permission information, the control unit 31 executes passing control to cause the vehicle 3A to travel in the check area E2 and the management area E1 at the preset low speed. If the control unit 31 has not received low-speed information together with permission information, the control unit 31 executes passing control to cause the vehicle 3A to travel in the check area E2 and the management area E1 at the normal speed that is higher than the preset low speed.

2. Other Embodiments

Next, the following describes other embodiments of the article transport facility.

Figure 20:
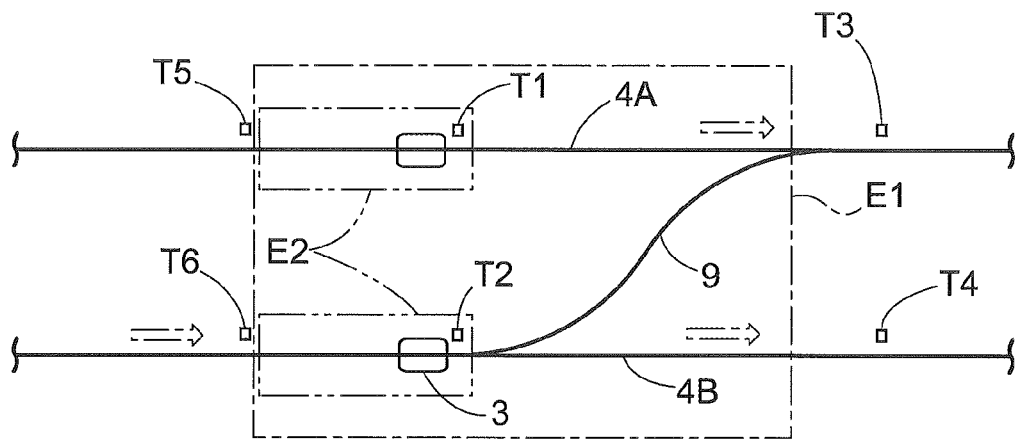
FIG. 20 shows a first path and a second path according to another embodiment.
Figure 21:
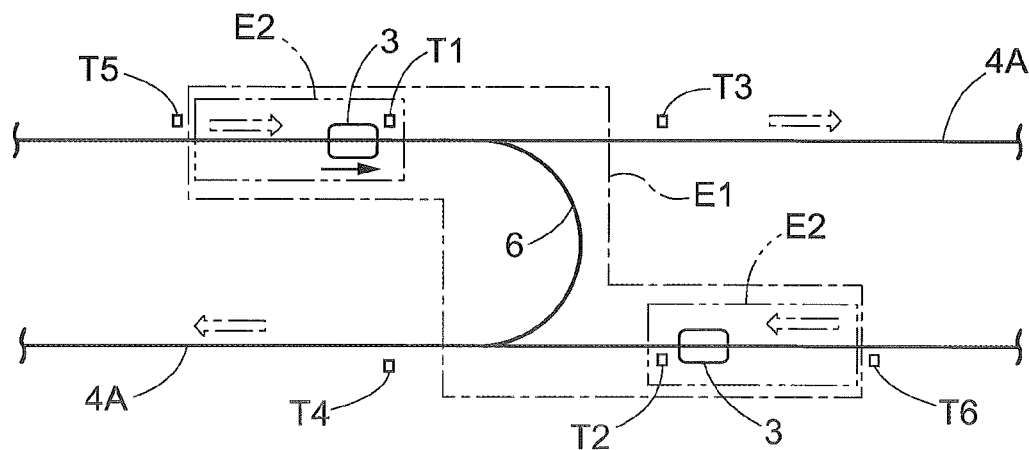
FIG. 21 shows a first path and a second path according to another embodiment.

(1) In the above-described embodiment, the first path 1A, the second path 1B, and the third path 1C are formed using the first main path 4A, the second main path 4B, and the transit path 9, and the second path 1B branches off from the first path 1A at the connection position of the first path 1A. However, as shown in FIG. 20, the first path 1A, the second path 1B, and the third path 1C may be formed using the first main path 4A, the second main path 4B, and the transit path 9, and the second path 1B may merge with the first path 1A at the connection position of the first path 1A. Also, paths that form the first path 1A, the second path 1B, and the third path 1C may be modified as appropriate. For example, as shown in FIG. 21, the first path 1A, the second path 1B, and the third path 1C may be formed using a pair of sections of the first main path 4A, which are parallel to each other and extend straight, and the shortcut paths 6.

(2) In the above-described embodiment, when an article transport vehicle 3 is to travel along the first path 1A via the first preparation position P7 and the first passing position P5 to pass through the management area E1, permission information is transmitted to the article transport vehicle 3 if there is no other article transport vehicle 3 that has been given passing permission for both the first path 1A and the second path 1B (to which permission information has been transmitted from the management apparatus H). However, when an article transport vehicle 3 is to travel along the first path 1A via the first preparation position P7 and the first passing position P5 to pass through the management area E1, permission information may be transmitted to the article transport vehicle 3 if there is no other article transport vehicle 3 that has been given passing permission for at least the first path 1A.

Also, when an article transport vehicle 3 is to travel via the first preparation position P7 and the second passing position P6 to pass through the management area E1, permission information may be transmitted to the article transport vehicle 3 if there is no other article transport vehicle 3 that has been given passing permission for at least the second path 1B.

(3) In the above-described embodiment, when there are a plurality of article transport vehicles 3 that are located in the check areas E2 and that have transmitted permission request information, permission information is preferentially transmitted to the article transport vehicle 3 whose elapsed time information indicates the longest elapsed time. However, the condition that is used to select the article transport vehicle 3 to which permission information is preferentially transmitted may be modified as appropriate. For example, permission information may be preferentially transmitted to an article transport vehicle 3 that is located on a path that is the same as the path on which the article transport vehicle 3 to which the previous permission information was transmitted is located.

(4) In the above-described embodiment, the management area E1 includes the first path 1A, the second path 1B, and the third path 1C, and branching and merging are performed in one management area E1. However, the management area E1 may include only the first path 1A and the second path 1B out of the first path 1A, the second path 1B, and the third path 1C, and only branching or merging may be performed.

(5) Note that the configurations disclosed in the above-described embodiment may be employed in combination with the configurations disclosed in the other embodiments unless inconsistency occurs. Also, regarding other configurations, the embodiments disclosed in the present description are merely examples in all aspects. Therefore, it is possible to apply various modifications as appropriate without departing from the spirit of the present disclosure.

3. Summary of Above-Described Embodiments

The following provides a summary of the above-described article transport facility.

The article transport facility includes: article transport vehicles configured to travel along a travelling path; and a management apparatus configured to manage the article transport vehicles.

The travelling path includes a first path and a second path that branches off from or merges with the first path at a connection position of the first path, a management area and a check area are provided for the first path, the management area includes a section from the connection position to a position that is at a first preset distance upstream of the connection position, and a section from the connection position to a position that is at a second preset distance downstream of the connection position, the check area includes a section from a preset position to a position that is at a fourth preset distance upstream of the preset position, the preset position being a position that is at a third preset distance upstream of the connection position of the first path, each transport vehicle includes a transport vehicle detection unit configured to detect that another article transport vehicle is present on the travelling path at a position that is downstream of the article transport vehicle, a communication unit configured to communicate information to and from the management apparatus, and a control unit, and in a state where an article transport vehicle that includes the control unit is located in the check area, the control unit determines whether or not the article transport vehicle is in a leading state where no other article transport vehicle is present forward of the article transport vehicle in the check area, based on detection information detected by the transport vehicle detection unit, and if the article transport vehicle is in the leading state, the control unit transmits permission request information for requesting permission to pass through the management area, from the communication unit to the management apparatus, and if the article transport vehicle is not in the leading state, the control unit does not transmit the permission request information.

With this configuration, the management apparatus can recognize the presence of an article transport vehicle on the first path based on the permission request information transmitted from the article transport vehicle. Therefore, it is unnecessary to provide sensors for detecting the article transport vehicles along the first path, and it is possible to eliminate the possibility of a failure occurring in the sensors.

Also, when an article transport vehicle enters the check area, if the article transport vehicle is the leading vehicle in the check area, the article transport vehicle transmits permission request information. However, when an article transport vehicle enters the check area, if the article transport vehicle is not the leading vehicle in the check area, the article transport vehicle does not transmit permission request information. In short, even if a plurality of article transport vehicles are present in the check area, only one vehicle, which is the leading vehicle, transmits permission request information. Therefore, an article transport vehicle that has transmitted permission request information to the management apparatus is always the leading article transport vehicle, and the management apparatus can easily recognize the leading article transport vehicle.

Preferably, a stop position is provided for the first path at a position that is at a fifth preset distance upstream of the connection position, the fifth preset distance is shorter than a distance that is obtained by adding the fourth preset distance to the third preset distance, the management apparatus transmits permission information to an article transport vehicle that is located in the check area and that has transmitted the permission request information, according to a state of one or more article transport vehicles on one or both of the first path and the second path, each article transport vehicle further includes an entrance detection unit configured to detect that the article transport vehicle has entered the check area, the control unit is configured to execute approaching stop control, transmission control, passing control, and stop control, the approaching stop control is executed if another article transport vehicle has stopped at a position that is forward of the article transport vehicle that includes the control unit to stop the article transport vehicle at a position that is upstream of the other article transport vehicle, the transmission control is executed on a condition that the entrance detection unit detects that the article transport vehicle that includes the control unit has entered the check area and is in the leading state, to transmit the permission request information from the communication unit to the management apparatus, the passing control is executed if the article transport vehicle that includes the control unit receives the permission information before reaching the stop position, to cause the article transport vehicle to pass through the check area and the management area, and the stop control is executed if the article transport vehicle that includes the control unit does not receive the permission information before reaching the stop position, to stop the article transport vehicle at the stop position.

With this configuration, if the control unit receives permission information before the article transport vehicle reaches the stop position, the control unit executes passing control so that the article transport vehicle passes through the check area and the management area. Also, if the control unit does not receive permission information before the article transport vehicle reaches the stop position, the control unit executes stop control so that the article transport vehicle stops at the stop position. If another article transport vehicle enters the check area while the article transport vehicle is stopped at the stop position, the other article transport vehicle does not transmit permission request information because it is not in a leading state, and is controlled so as to stop at a position that is upstream of the article transport vehicle that has stopped at the stop position, as a result of approaching stop control. In this way, an article transport vehicle that is not in a leading state does not need to transmit information to the management apparatus. Therefore, it is possible to reduce the amount of information that is transmitted between the article transport vehicles and the management apparatus.

It is also preferable that the article transport facility further includes a communication apparatus configured to be operated by an operator, wherein the communication apparatus is configured to transmit stop information and stop cancellation information to the communication unit of each article transport vehicle, and if the communication unit receives the stop information while the control unit is executing the approaching stop control, the passing control, or the stop control, the control unit suspends control that is being executed and brings the article transport vehicle that includes the control unit into a forcibly stopped state where the article transport vehicle is forcibly stopped, and if the communication unit receives the stop cancellation information, the control unit cancels the forcibly stopped state and executes the suspended control.

With this configuration, the operator can bring an article transport vehicle into a forcibly stopped state by operating the communication apparatus. For example, when a disabled article transport vehicle has stopped on the travelling path, if an article transport vehicle that follows the disabled article transport vehicle has stopped at a position that is upstream of the disabled article transport vehicle, the article transport vehicle that has stopped as a result of approaching stop control travels forward as the operator moves the disabled article transport vehicle forward. Therefore, there is the risk of the article transport vehicle travelling forward coming into contact with the operator. Considering the risk, the operator can prevent the following article transport vehicle from travelling when the operator performs work on the disabled article transport vehicle, by operating the communication apparatus to bring the following article transport vehicle into a forcibly stopped state in advance.

It is also preferable that the second path is a path that branches off from the connection position of the first path, the management area further includes, in addition to the sections of the first path, a section of the second path from the connection position to a position that is at an eighth preset distance downstream of the connection position, a first passing position is provided for the first path at a position that is at a sixth preset distance downstream of the connection position, a second passing position is provided for the second path at a position that is at a seventh preset distance downstream of the connection position, the sixth preset distance is longer than the second preset distance, the seventh preset distance is longer than the eighth preset distance, each article transport vehicle further includes a passing detection unit configured to detect that the article transport vehicle is located at the first passing position and the second passing position, if an article transport vehicle that includes the control unit reaches the first passing position or the second passing position, the control unit transmits passing information from the communication unit to the management apparatus, and the management apparatus determines that the article transport vehicle to which the management apparatus has transmitted the permission information is present in the management area until the management apparatus receives the passing information from the article transport vehicle, and the management apparatus does not transmit the permission information as long as the management apparatus determines that the article transport vehicle is present in the management area, and if the management apparatus determines that the article transport vehicle is not present in the management area, the management apparatus transmits the permission information to an article transport vehicle that is located in the check area and that has transmitted the permission request information to the management apparatus.

With this configuration, the first passing position and the second passing position are provided outside the management area. Therefore, an article transport vehicle that has travelled to the first passing position or the second passing position has passed through the management area. If an article transport vehicle has travelled to the first passing position or the second passing position, the article transport vehicle transmits passing information to the management apparatus.

As a result of transmitting permission information to an article transport vehicle and receiving passing information from the article transport vehicle, the management apparatus can determine whether or not the article transport vehicle travelling based on the permission information is present in the management area. Therefore, it is unnecessary to provide sensors for detecting the presence or absence of article transport vehicles, along the first path and the second path.

It is also preferable that the second path is a path that branches off from the connection position of the first path, the management area further includes, in addition to the sections of the first path, a section of the second path from the connection position to a position that is at an eighth preset distance downstream of the connection position, a stop position is provided for the first path at a position that is at a fifth preset distance upstream of the connection position, the fifth preset distance is shorter than a distance that is obtained by adding the fourth preset distance to the third preset distance, in a state where an article transport vehicle that includes the control unit is located in the check area, the control unit transmits travel schedule information that indicates whether the article transport vehicle is to travel along the first path downstream from the connection position, or to travel along the second path downstream from the connection position, from the communication unit to the management apparatus, together with the permission request information, if the management apparatus receives the permission request information, the management apparatus transmits permission information to the article transport vehicle that transmitted the permission request information, according to a state of one or more article transport vehicles on both of the first path and the second path, and if the control unit receives the permission information before the article transport vehicle that includes the control unit reaches the stop position, the control unit causes the transport vehicle to pass through the check area and the management area, and if the control unit does not receive the permission information before the article transport vehicle reaches the stop position, the control unit stops the article transport vehicle at the stop position.

With this configuration, an article transport vehicle transmits travel schedule information together with permission request information, from the communication unit to the management apparatus. Therefore, the management apparatus that has received the travel schedule information can easily recognize the travelling states of article transport vehicles on the first path and the second path.

Then, the management apparatus transmits permission information to article transport vehicles according to the states of article transport vehicles on both the first path and the second path, regardless of the content of the travel schedule information transmitted from an article transport vehicle. That is, for example, the management apparatus transmits permission information to an article transport vehicle that is to travel along the first path downstream from the connection position, based on not only the states of article transport vehicles on the first path, but also the states of article transport vehicles on the second path. Therefore, it is possible to avoid a case in which an article transport vehicle travelling along the first path comes into contact with an article transport vehicle that has stopped at the upstream end of the second path because permission information was transmitted to the article transport vehicle that was to travel along the first path downstream from the connection position despite the disabled article transport vehicle having stopped at the upstream end of the second path. In this way, with this configuration, it is possible to prevent article transport vehicles that travel along different paths in the management area from coming into contact with each other.

It is also preferable that each article transport vehicle further includes a measurement unit configured to measure elapsed time, if an article transport vehicle that includes the control unit is located in the check area and is in the leading state, the control unit transmits the permission request information at preset time intervals, measures the time elapsed since the first transmission of the permission request information, and at the second and later transmissions of the permission request information, the control unit transmits elapsed time information that indicates the elapsed time, together with the permission request information, and when the management apparatus transmits permission information to an article transport vehicle that is located in the check area and that has transmitted the permission request information, according to a state of one or more article transport vehicles on one or both of the first path and the second path, if a plurality of article transport vehicles are located in the check area and have transmitted the permission request information, the management apparatus preferentially transmits the permission information to an article transport vehicle whose elapsed time information indicates the longest elapsed time.

With this configuration, if there are a plurality of article transport vehicles that are located in the check area and that have transmitted permission request information, permission information is preferentially transmitted to the article transport vehicle whose elapsed time information indicates the longest elapsed time since the transmission of permission request information. Therefore, it is possible to avoid a case in which an article transport vehicle remains in the check area for a long time after transmitting permission request information.

INDUSTRIAL APPLICABILITY

The technology according to the present disclosure is applicable to an article transport facility that includes an article transport vehicle that travels along a travelling path.

What is claimed is:
1. An article transport facility comprising:
article transport vehicles configured to travel along a travelling path; and
a management apparatus configured to manage the article transport vehicles, wherein:
the travelling path includes a first path and a second path that branches off from or merges with the first path at a connection position of the first path,
a management area and a check area are provided for the first path,
the management area includes a section from the connection position to a position that is at a first preset distance upstream of the connection position, and a section from the connection position to a position that is at a second preset distance downstream of the connection position, the check area includes a section from a preset position to a position that is at a fourth preset distance upstream of the preset position, the preset position being a position that is at a third preset distance upstream of the connection position of the first path, each transport vehicle includes a transport vehicle detection unit configured to detect that another article transport vehicle is present on the travelling path at a position that is downstream of the article transport vehicle, a communication unit configured to communicate information to and from the management apparatus, and a control unit, and in a state where an article transport vehicle that includes the control unit is located in the check area, the control unit determines whether or not the article transport vehicle is in a leading state where no other article transport vehicle is present forward of the article transport vehicle in the check area, based on detection information detected by the transport vehicle detection unit, and if the article transport vehicle is in the leading state, the control unit transmits permission request information for requesting permission to pass through the management area, from the communication unit to the management apparatus, and if the article transport vehicle is not in the leading state, the control unit does not transmit the permission request information.

2. The article transport facility according to claim 1, wherein:

a stop position is provided for the first path at a position that is at a fifth preset distance upstream of the connection position, the fifth preset distance is shorter than a distance that is obtained by adding the fourth preset distance to the third preset distance, the management apparatus transmits permission information to an article transport vehicle that is located in the check area and that has transmitted the permission request information, according to a state of one or more article transport vehicles on one or both of the first path and the second path, each article transport vehicle further includes an entrance detection unit configured to detect that the article transport vehicle has entered the check area, the control unit is configured to execute approaching stop control, transmission control, passing control, and stop control, the approaching stop control is executed if another article transport vehicle has stopped at a position that is forward of the article transport vehicle that includes the control unit to stop the article transport vehicle at a position that is upstream of the other article transport vehicle, the transmission control is executed on a condition that the entrance detection unit detects that the article transport vehicle that includes the control unit has entered the check area and is in the leading state, to transmit the permission request information from the communication unit to the management apparatus, the passing control is executed if the article transport vehicle that includes the control unit receives the permission information before reaching the stop position, to cause the article transport vehicle to pass through the check area and the management area, and the stop control is executed if the article transport vehicle that includes the control unit does not receive the permission information before reaching the stop position, to stop the article transport vehicle at the stop position.

3. The article transport facility according to claim 2, further comprising:

a communication apparatus configured to be operated by an operator, wherein the communication apparatus is configured to transmit stop information and stop cancellation information to the communication unit of each article transport vehicle, and wherein if the communication unit receives the stop information while the control unit is executing the approaching stop control, the passing control, or the stop control, the control unit suspends control that is being executed and brings the article transport vehicle that includes the control unit into a forcibly stopped state where the article transport vehicle is forcibly stopped, and if the communication unit receives the stop cancellation information, the control unit cancels the forcibly stopped state and executes the suspended control.

4. The article transport facility according to claim 1, wherein:

the second path is a path that branches off from the connection position of the first path, the management area further includes, in addition to the sections of the first path, a section of the second path from the connection position to a position that is at an eighth preset distance downstream of the connection position, a first passing position is provided for the first path at a position that is at a sixth preset distance downstream of the connection position, a second passing position is provided for the second path at a position that is at a seventh preset distance downstream of the connection position, the sixth preset distance is longer than the second preset distance, the seventh preset distance is longer than the eighth preset distance, each article transport vehicle further includes a passing detection unit configured to detect that the article transport vehicle is located at the first passing position and the second passing position, if an article transport vehicle that includes the control unit reaches the first passing position or the second passing position, the control unit transmits passing information from the communication unit to the management apparatus, and the management apparatus determines that the article transport vehicle to which the management apparatus has transmitted the permission information is present in the management area until the management apparatus receives the passing information from the article transport vehicle, and the management apparatus does not transmit the permission information as long as the management apparatus determines that the article transport vehicle is present in the management area, and if the management apparatus determines that the article transport vehicle is not present in the management area, the management apparatus transmits the permission information to an article transport vehicle that is located in the check area and that has transmitted the permission request information to the management apparatus.

5. The article transport facility according to claim 1, wherein:
the second path is a path that branches off from the connection position of the first path,
the management area further includes, in addition to the sections of the first path, a section of the second path from the connection position to a position that is at an eighth preset distance downstream of the connection position,
a stop position is provided for the first path at a position that is at a fifth preset distance upstream of the connection position,
the fifth preset distance is shorter than a distance that is obtained by adding the fourth preset distance to the third preset distance,
in a state where an article transport vehicle that includes the control unit is located in the check area, the control unit transmits travel schedule information that indicates whether the article transport vehicle is to travel along the first path downstream from the connection position, or to travel along the second path downstream from the connection position, from the communication unit to the management apparatus, together with the permission request information,
if the management apparatus receives the permission request information, the management apparatus transmits permission information to the article transport vehicle that transmitted the permission request information, according to a state of one or more article transport vehicles on both of the first path and the second path, and
if the control unit receives the permission information before the article transport vehicle that includes the control unit reaches the stop position, the control unit causes the transport vehicle to pass through the check area and the management area, and if the control unit does not receive the permission information before the article transport vehicle reaches the stop position, the control unit stops the article transport vehicle at the stop position.

6. The article transport facility according to claim 1, wherein:
each article transport vehicle further includes a measurement unit configured to measure elapsed time,
if an article transport vehicle that includes the control unit is located in the check area and is in the leading state, the control unit transmits the permission request information at preset time intervals, measures the time elapsed since the first transmission of the permission request information, and at the second and later transmissions of the permission request information, the control unit transmits elapsed time information that indicates the elapsed time, together with the permission request information, and
when the management apparatus transmits permission information to an article transport vehicle that is located in the check area and that has transmitted the permission request information, according to a state of one or more article transport vehicles on one or both of the first path and the second path, if a plurality of article transport vehicles are located in the check area and have transmitted the permission request information, the management apparatus preferentially transmits the permission information to an article transport vehicle whose elapsed time information indicates the longest elapsed time.

* * * * *